(12) United States Patent
Ebihara et al.

(10) Patent No.: US 10,171,765 B1
(45) Date of Patent: Jan. 1, 2019

(54) BIT LINE BOOST FOR FAST SETTLING WITH CURRENT SOURCE OF ADJUSTABLE SIZE

(71) Applicant: OmniVision Technologies, Inc., Santa Clara, CA (US)

(72) Inventors: Hiroaki Ebihara, San Jose, CA (US); Xueqing Wang, Milpitas, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/853,508

(22) Filed: Dec. 22, 2017

(51) Int. Cl.
   *H04N 5/374* (2011.01)
   *H04N 5/235* (2006.01)
   *H01L 27/146* (2006.01)
   *H04N 5/378* (2011.01)

(52) U.S. Cl.
   CPC ..... *H04N 5/3742* (2013.01); *H01L 27/14643* (2013.01); *H04N 5/2355* (2013.01); *H04N 5/378* (2013.01)

(58) Field of Classification Search
   None
   See application file for complete search history.

(56) References Cited

U.S. PATENT DOCUMENTS

2015/0208008 A1    7/2015  Gendai
2015/0357369 A1*  12/2015  Kobayashi ............. H04N 5/378
                                                         250/208.1

* cited by examiner

*Primary Examiner* — Mark T Monk

(57) ABSTRACT

A photodiode is adapted to accumulate image charges. A transfer transistor transfers the image charges to the floating diffusion. A source follower transistor is coupled to receive the voltage of the floating diffusion and provide an amplified signal. A row select transistor enables the amplified signal and outputs the amplified signal to a bitline. A first current source generator is coupled between the bitline and a ground. The first current source generator sinks current through a first cascode transistor, a first bias transistor and a second bias transistor. The first cascode transistor is biased by a cascode control voltage. The first bias transistor and the second bias transistor are biased by a bias control voltage.

41 Claims, 8 Drawing Sheets

BIT LINE BOOST FOR FAST SETTLING WITH CURRENT SOURCE OF ADJUSTABLE SIZE

TECHNICAL FIELD

This disclosure relates generally to Complementary Metal-Oxide-Semiconductor (CMOS) image sensors, and in particular but not exclusively, relates to apparatus and method applied to photodiode pixel cells and their output line (bitline) in image sensor that is capable of fast settling the bitline during the readout of the image signal to reduce fixed pattern noise (FPN) and to maintain stability of the supply power.

BACKGROUND INFORMATION

Image sensors have become ubiquitous. They are widely used in digital still cameras, cellular phones, security cameras, as well as medical, automobile, and other applications. High dynamic range (HDR) image sensors have been required by many of those applications. Human eyes normally possess a dynamic range of up to about 100 dB. For automobile applications, an image sensor of more than 100 dB dynamic range to deal with different driving conditions, such as driving through a dark tunnel into bright sunlight, is often required.

HDR image sensors do not always perform HDR functions properly. Common drawbacks include image degradation due to fixed pattern noise (FPN), large random noise, reduced resolution associated with charge blooming, motion artifacts, fixed sensitivity, and lower fill factor when multiple photodiodes are used, where fill factor is a ratio of a pixel's light sensitivity area to its total area.

When image sensors are used, photo-generated electrons in each of the plurality of pixel cells are transferred from the photodiode (PD) to the floating diffusion (FD) for subsequent readout. The transfer (TX) transistor coupled between the PD and the FD is switched on and off under the control of a voltage pulse asserted to the TX gate terminal to enable this charge transfer. Due to an always-presented coupling capacitance between the TX gate terminal and the FD, the pulse signal asserted on the TX gate is always largely coupled to the FD. This tunneling effect due to the TX signal is called TX feed-through.

Similarly, the reset (RST) transistor coupled between the power supply AVDD and the FD is switched on and off under the control of a voltage pulse asserted to the RST gate terminal to enable the voltage reset to the FD. Again, due to an always-presented coupling capacitance between the RST gate terminal and the FD, the pulse signal asserted on the RST gate is always largely coupled to the FD as well. This is called RST feed-through.

Both the RST feed-through and TX feed-through ripple through a source follower (SF) transistor and a row select (RS) transistor to an output line, also called a bitline, of the pixel cell. Such a propagation of a large unwanted pulse is unavoidable and harmful to the settlement of the signals. It reduces the frame rate of the image sensors even for dark signals (which are signals caused by non-photo-generated, intrinsic electrons inside the pixel). For any given bitline, since it connects to all the pixels in the column, it possesses a significant amount of capacitive and resistive (RC) load. Therefore, any state changes on the bitline are unavoidably slow due to this RC delay. That is, once a status change happens on the bitline, it takes a long time to settle to the newly updated step level. This is governed by the so-called RC time constant. For any given input step Vin, its settling time is governed by $$t_{settle} = \tau \cdot \ln \frac{V_{in}}{V_{0.5LSB}},$$

where time constant $\tau$=RC, and $V_{0.5LSB}$ is half the value of a single bit equivalent voltage.

One solution is to disconnect the pixel cell from its output line (bitline) during the charge transfer, also with the help of an added clamp voltage generator. The clamp voltage generator does not allow the bitline voltage to drop below a certain voltage level. Therefore, when the charge transfer takes place, the voltage change on bit lines can be reduced and settling time can be shortened. In addition, the total analog power supply (AVDD) current is maintained near constant by the clamp voltage generator to avoid large variations on the power supply. With this solution, after the RS transistor is switched back on again to reengage the pixel output to the bitline, under complete dark condition which is correlated to the highest voltage, the bitline is charged by a pull-up-current through the SF transistor instead of being sunk by a pull-down-current of a relatively weak current source generator. Settling time is also reduced because the SF current is not limited by the current source generator. A faster pull up is always reached. That means, a faster settling on low lighting condition is clearly favored for this solution. Nevertheless, performance on strong lighting condition is still a problem, since higher contrasts in light intensities involve larger voltages drops on bitline which directly leads to a longer settling time.

Some solutions may offer decent result. However, they may involve fairly complex circuit such as amplifiers and controllers which occupy a lot of additional silicon area for each column readout circuit, and consumes more power to execute.

BRIEF DESCRIPTION OF THE DRAWINGS

Non-limiting and non-exhaustive examples of the invention are described with reference to the following figures, wherein like reference numerals refer to like parts throughout the various views unless otherwise specified.

Figure 1:
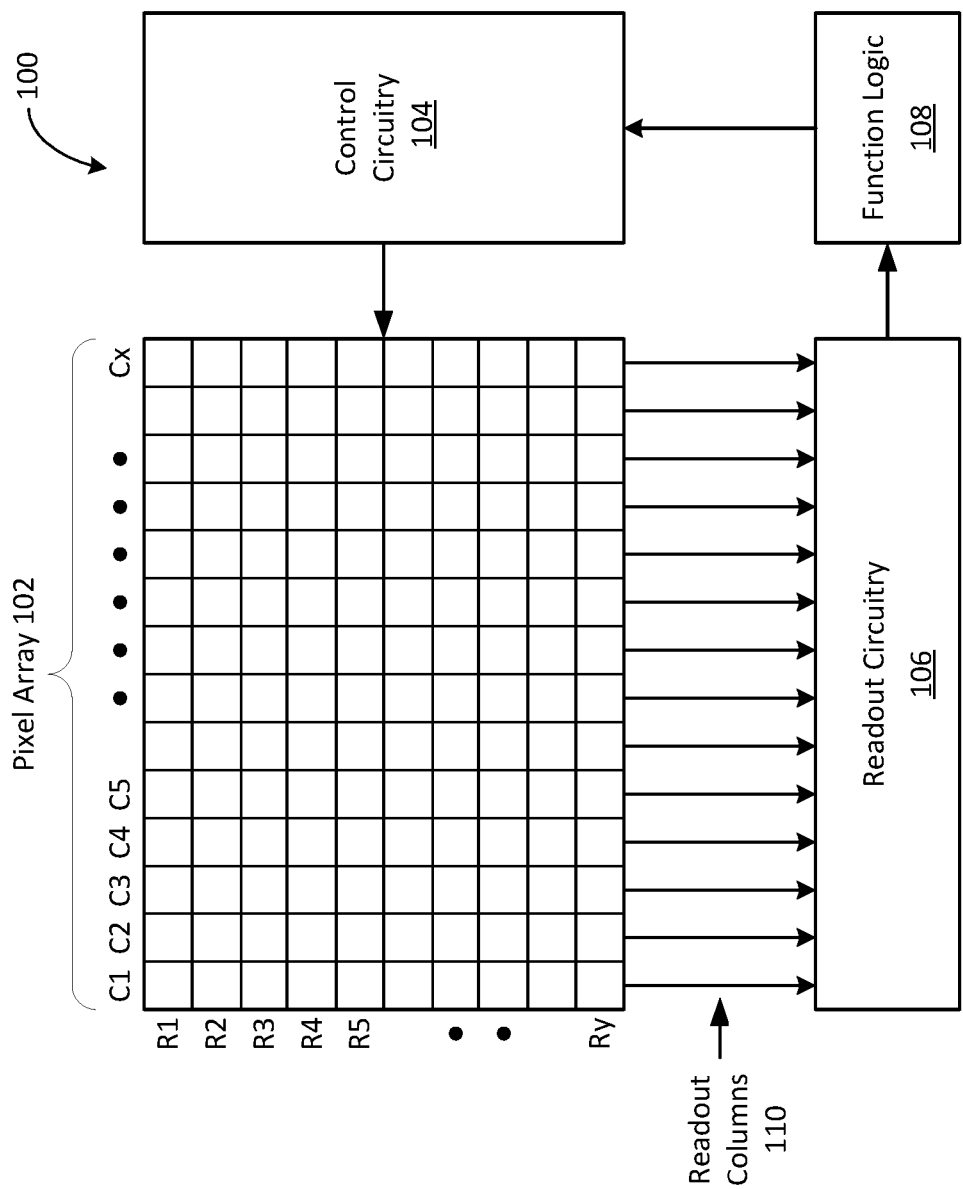
FIG. 1 illustrates one example of an imaging system in accordance with an embodiment of the present disclosure.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

Embodiments of an apparatus and method for a fast settling pixel output line in an imaging sensor are described herein. In the following description, numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Throughout this specification, several terms of art are used. These terms are to take on their ordinary meaning in the art from which they come, unless specifically defined herein or the context of their use would clearly suggest otherwise.

FIG. 1 illustrates one example of an imaging system 100 in accordance with an embodiment of the present disclosure. Imaging system 100 includes pixel array 102, control circuitry 104, readout circuitry 106, and function logic 108. In one example, pixel array 102 is a two-dimensional (2D) array of photodiodes, or image sensor pixels (e.g., pixels P1, P2 . . . , Pn). As illustrated, photodiodes are arranged into rows (e.g., rows R1 to Ry) and columns (e.g., column C1 to Cx) to acquire image data of a person, place, object, etc., which can then be used to render a 2D image of the person, place, object, etc. However, photodiodes do not have to be arranged into rows and columns and may take other configurations.

In one example, after each image sensor photodiode/pixel in pixel array 102 has acquired its image charge through photo-generation of the image charge, corresponding image data is readout by readout circuitry 106 and then transferred to function logic 108. Readout circuitry 106 may be coupled to readout image data from the plurality of photodiodes in pixel array 102. In various examples, readout circuitry 106 may include amplification circuitry, analog-to-digital (ADC) conversion circuitry, or otherwise. In one example, readout circuitry 106 may readout a row of image data at a time along readout column lines 110 (illustrated) or may readout the image data using a variety of other techniques (not illustrated), such as a serial readout or a full parallel readout of all pixels simultaneously. Function logic 108 may store the image data or even manipulate the image data by applying post image effects (e.g., crop, rotate, remove red eye, adjust brightness, adjust contrast, or otherwise).

In some embodiments, function logic 108 may require certain imaging conditions to be met and may therefore instruct the control circuitry 104 to manipulate certain parameters in pixel array 102 to achieve better qualities or special effects.

Figure 2:
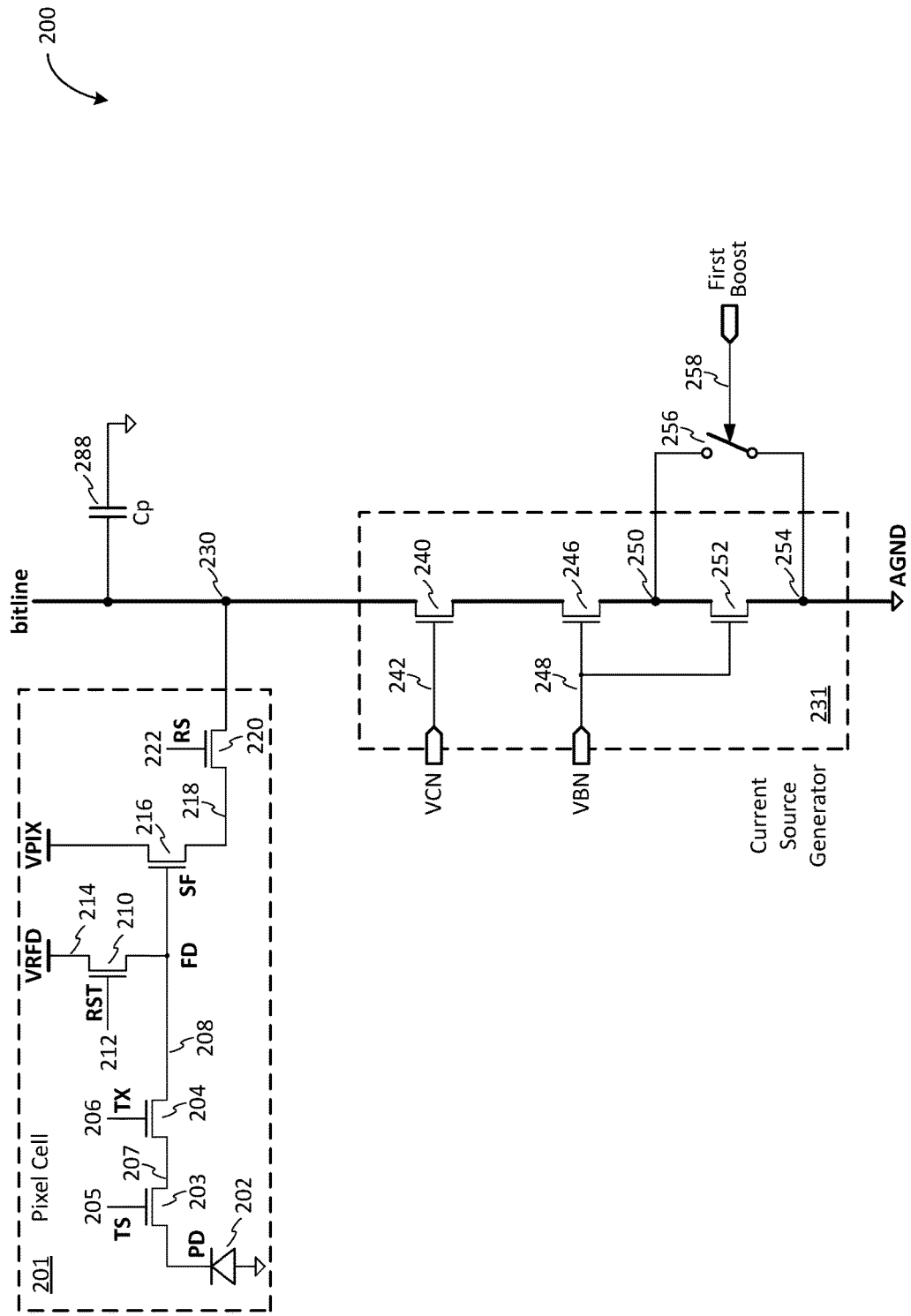
FIG. 2 is a first example schematic of a block diagram of a pixel cell and pixel output circuit in an imaging sensor that is capable of fast settling in its bitline in accordance with an embodiment of the present disclosure.

FIG. 2 is a first example of block diagram of a pixel cell and pixel output circuit in an imaging sensor that is capable of fast settling on its output line, bitline 230, in accordance with an embodiment of the present disclosure. The illustrated embodiment of image sensor system 200 may comprise a detecting photodiode (PD) 202 in a typical 4 transistor (4T) pixel cell 201, where the 4T portion may include a transfer (TX) transistor 204, a reset (RST) transistor 210, a source follower (SF) transistor 216, and a row select (RS) transistor 220. In one embodiment, the RS transistor 220 is connected between the source terminal of the SF transistor 216 and the bitline 224, the drain terminal of the SF transistor 216 is connected to a pixel voltage (VPIX) directly, as shown in FIG. 2. In another embodiment, the RS transistor 220 is connected between the drain terminal of the SF transistor 216 and the VPIX. The VPIX may be connected to a power supply voltage AVDD, or may be connected to a regulated voltage supply, where the regulated voltage supply is regulated based on the supply from the AVDD. The node where the drain of the TX transistor 204, the source of the RST transistor 210, and the gate of the SF transistor 216 meet is a floating diffusion (FD) 208. A reset (RST) gate voltage 212 and a RS gate voltage 222 which are under the control of the control circuitry 104 (see FIG. 1) enable conductions of the RST transistor 210 and the RS transistor 220, respectively.

The TX transistor 204 is enabled by a transfer (TX) gate voltage 206. The TX transistor 204 can be switched on when a high connect voltage is asserted to the TX gate 206, under which, in one embodiment, the photodiode (PD) 202 is connected to the TX receiving terminal 207 of the TX transistor 204 directly, the photo-generated signal charges accumulated at the PD 202 can be transferred to the FD 208 through the TX transistor 204. In another embodiment, the stored charges presented at the TX receiving terminal 207 of the TX transistor 204 which are transferred by the transfer storage (TS) transistor 203 from the PD 202 may be transferred to the FD 208 through the TX transistor 204. The TX transistor 204 can be switched off when a low enough disconnecting voltage is asserted to the TX gate 206.

The RST transistor 210 is enabled by a reset (RST) gate voltage. The RST transistor 210 can be switched on when a high voltage is asserted to the RST gate 212, under which a reset FD voltage (VRFD) is used to reset the FD 208 to the VRFD. The VRFD is a dedicated voltage to reset the floating diffusion controlled by the control circuitry 104. The VRFD may or may not have the same voltage of the VPIX. The RST transistor 210 can be switched off when a low voltage is asserted to the RST gate 212.

The amplified image signal from the source terminal of the SF transistor 216 is delivered to the bitline 230 when the RS transistor 220 is switched on when the RS gate voltage 222 is set to high. The analog image signal on the bitline 230 is eventually presented to an input terminal of an ADC. In one embodiment, such an ADC is one of the pluralities of ADCs coupled to each bitlines, or readout columns 110 as shown in FIG. 1.

A first current source (CS) generator 231 connects between the bitline 230 and a ground (AGND). The first CS generator 231 provides adjustable current to the bitline 230 by three serially connected transistors: a first cascode transistor 240, a first bias transistor 246, and a second bias transistor 252. The first cascode transistor 240 is controlled (or biased) by a cascode control voltage, VCN 242. The first bias transistor 246 and the second bias transistor 252 are both controlled (or biased) by a bias control voltage, VBN 248.

An appropriate cascode control voltage VCN 242 and an appropriate bias control voltage VBN 248 are need for normal operation of the first CS generator 231. The cascode control voltage VCN 242 and the bias control voltage VBN 248 are controlled by the control circuit 104.

When either RST voltage or TX voltage goes low, the FD voltage also goes low in react due to the effect of charge injection through a capacitance (such a capacitance may be an intrinsic capacitance, an overlap capacitance, and/or a metal coupling capacitance) between the gate terminal and the source terminal of either the RST transistor 210 or the TX transistor 204. Such a voltage disturbance to the FD propagates all the way thought the SF transistor 216 to the bitline 230. As a result, the bitline 230 needs to wait an extra time before the signal is read out until the disturbed voltage on it is settled. The frame rate is dragged down since the settling time of the bitline affects the overall time of the signal readout of the image sensor.

One of the methods to reduce the settling time is to increase (or boost) the bitline current temporarily when the RST voltage or the TX voltage goes from high to low.

The first CS generator 231 is a current source. It serves to pull down (or to sink) current from the bitline 230. The stronger a current the first CS generator 231 may sink, the faster the bitline 230 may settle, and the faster the frame rate of the image sensor may achieve. The amount of the electrical current that a current source is capable of sourcing or sinking (sinking in this current disclosure) is limited by its physical form factor (or size). For any given transistor, in general, its capability of handling current is proportional to its equivalent width W and inversely proportional to its equivalent length L. It becomes clear that current can be boosted by increasing W or reducing L, or increasing W and reducing L simultaneously. This method is especially sounding when the current sources are initially operated under low transconductance (gm) and it's feasible to increase the transconductance of the current sources.

Of the two bias transistors connected in serial in the first CS generator 231: the first bias transistor 246 and the second bias transistor 252, if the first bias transistor 246 has an equivalent length of $L_{246}$ and the second bias transistor 252 has an equivalent length of $L_{252}$, if one of the transistor is shorted, it means that that transistor is bypassed, the overall equivalent length $L_{boost}$ of the two bias transistors 246 and 252 is reduced from $L_{init}=L_{246}+L_{252}$, to $L_{boost}=L_{246}<L_{init}$, if $L_{252}=0$ when the second bias transistor 252 is shorted, in one embodiment of the disclosure, the current flows through both bias transistors 246 and 252 is increased (or boosted) if the second bias transistor 252 is bypassed.

In FIG. 2, the second bias transistor 252 may be bypassed by a first boost enable switch 256, in accordance with an embodiment of the present disclosure. The first boost enable switch 256 connects between a drain terminal 250 and a source terminal 254 of the second bias transistor 252. And said first boost enable switch 256 is turned on and off by a first boost enable signal (First Boost) 258. The first boost enable signal (First Boost) 258 is controlled by the control circuitry 104.

Figure 3:
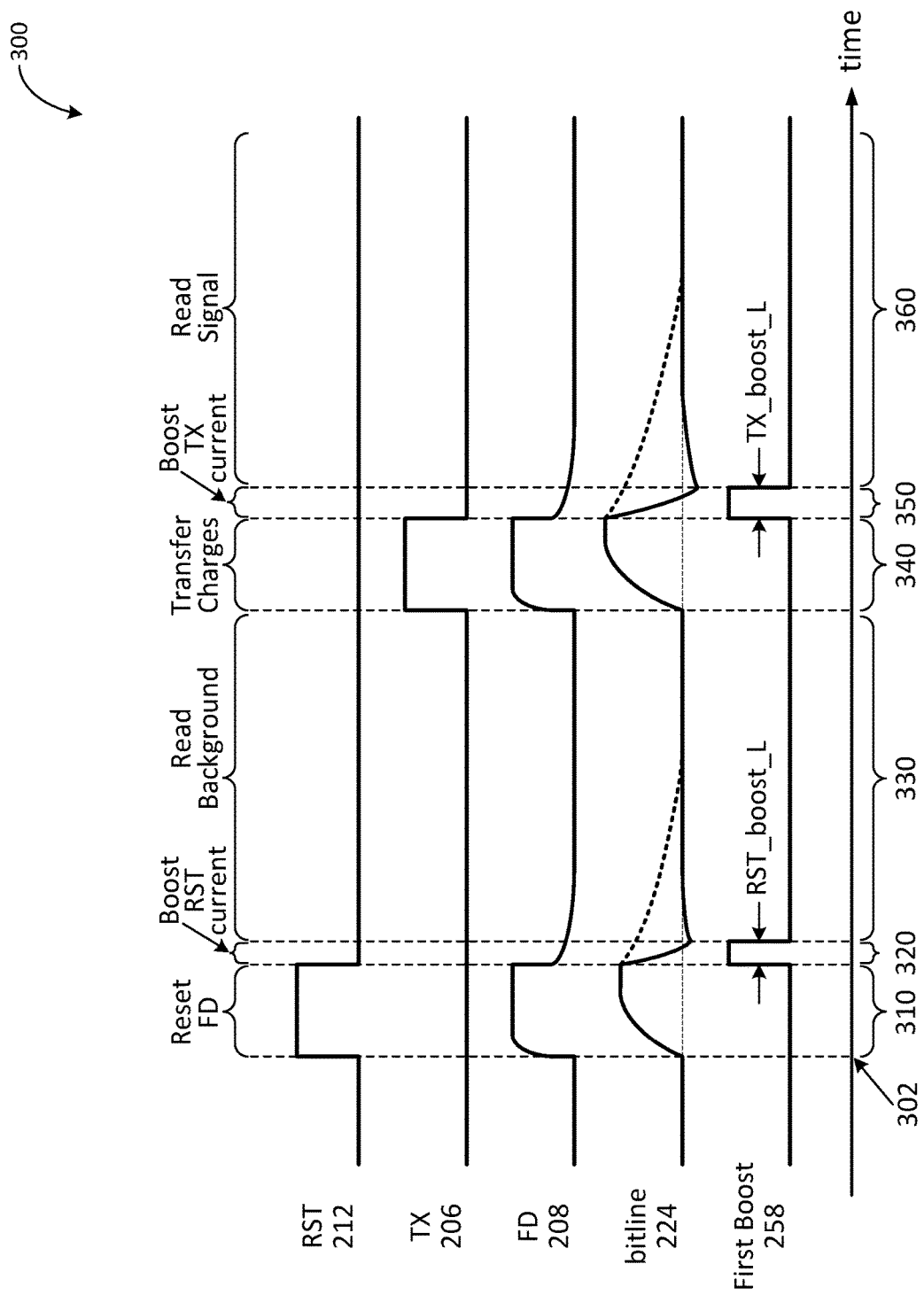
FIG. 3 is a first example waveform in association with the operation of the photodiode in an imaging sensor in dealing with bitline settling in associate with the circuit of FIG. 2 in accordance with an embodiment of the present disclosure.

FIG. 3 is an illustrative signal readout operation 300 of a pixel cell and its output circuit in an imaging sensor that is capable of fast settling of its output line, the bitline 230, in accordance with an embodiment of the present disclosure. To better understand FIG. 3 and the sequence it represents, a timing flowchart is provided in FIG. 4 to explain all major events that take place in FIG. 3 in conjunction with FIG. 2.

Figure 4:
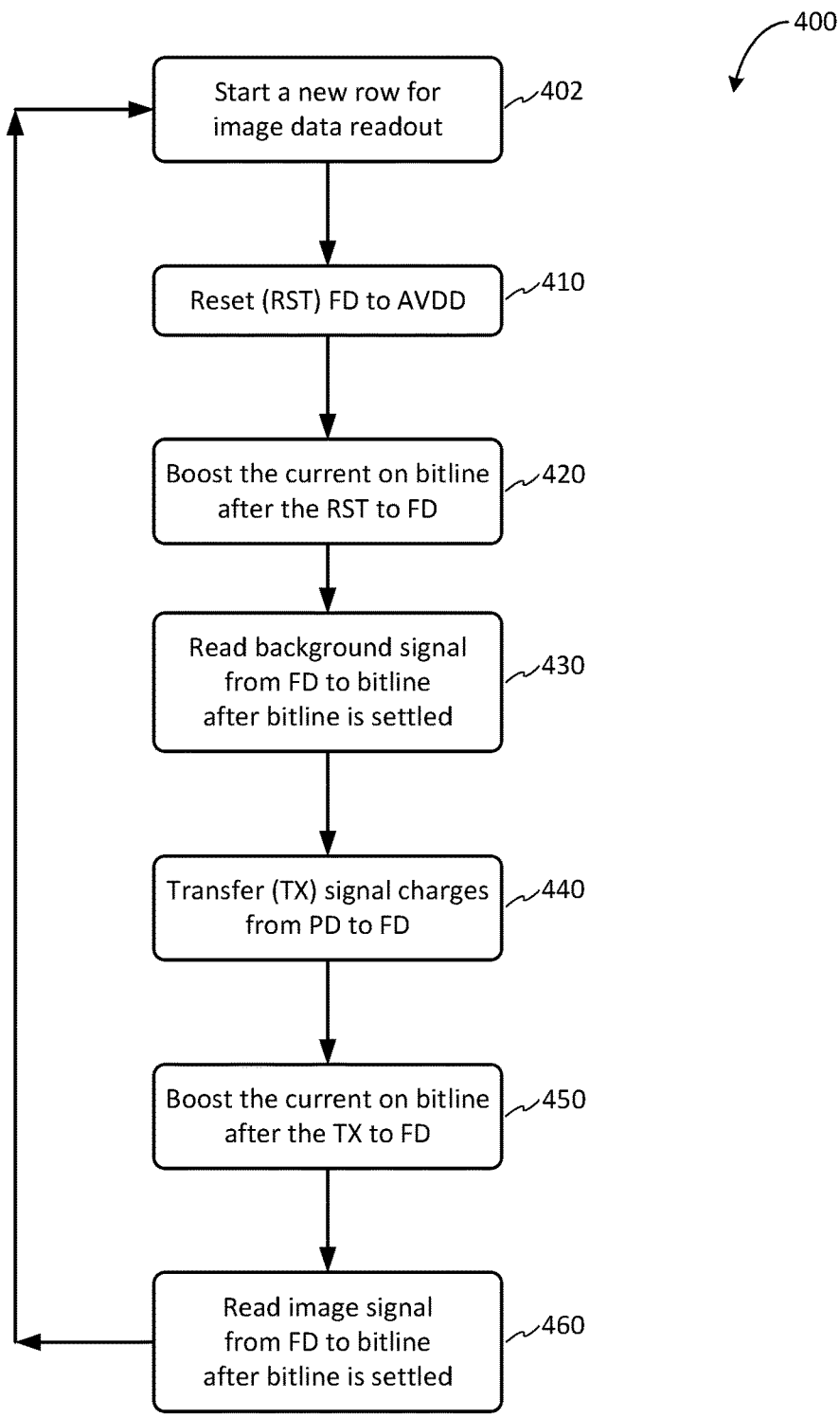
FIG. 4 is an illustrative flow chart in associate with the events of FIG. 3 in accordance with an embodiment of the present disclosure.

FIG. 4 is an illustrative flow chart 400 in accordance with an embodiment of the present disclosure. The flow chart 400 may illustrate a complete cycle of row readout and demonstrates how fast settling on the bitline 230 may be achieved in a typical data readout cycle using the disclosed circuitry 200.

The flow chart 400 begins at process block 402. Process block 402 (correlated to time point 302 in FIG. 3) marks the beginning of a readout cycle where a new row of a plurality of pixel cells is being read out by the readout circuitry 106.

To begin, the first cascode transistor 240 is biased by a cascode control voltage (VCN) 242. The cascode control voltage (VCN) 242 represents a positive potential to ensure normal operation of the first cascode transistor 240. The cascode control voltage (VCN) 242 needs to be high enough so that the voltage between the gate terminal and the source terminal of the first cascode transistor 240 is higher than the threshold voltage of said first cascode transistor 240.

The first bias transistor 246 and the second bias transistor 252 are both biased by the same bias control voltage (VBN) 248. The bias control voltage (VBN) 248 is a positive potential to ensure normal operation of both the first bias transistor 246 and the second bias transistor 252. The bias control voltage (VBN) 248 needs to be high enough so that either voltage between the gate terminal and the source terminal of the first bias transistor 246 or the second bias transistor 252 is higher than the threshold voltage of either the first bias transistor 246 or the second bias transistor 252.

The process block 402 may be followed by process block 410. Process block 410 is correlated to the time region 310 shown in FIG. 3. Circuit-condition-wise, during block 410, the RST transistor 210 is switched on by the RST gate voltage 212 to reset the FD 208 to the VRFD. During the same period, the RS transistor 220 remains closed by setting the RS gate voltage 222 to high. The first boost enable switch 256 maintains open by setting the first boost enable signal (First Boost) 258 to low. The second bias transistor 252 is not shorted yet during the process block 410.

Prior to the block 410, FD voltage is not the VRFD, it's lower than the VRFD typically because of the existence of some electrons or charge injection when RST turns off in the previous readout cycle. During the block 410, voltage disturbance onto the FD 208 caused by the rising edge of the RST voltage signal is evident due to the reset of the FD 208 to the VRFD. Such a disturbance on the FD 208 propagates to the bitline 230 through the SF transistor 216, and cause a slow rising bump on the bitline 230 as shown in the time region 310 of FIG. 3.

The process block 410 may be followed by process block 420. Process block 420 is correlated to the time region 320 shown in FIG. 3. During block 420, the FD 208 is disconnected from the dedicated bias voltage, the VRFD for example, by setting the RST gate 212 to low to switch off the RST transistor 210. The first boost enable signal (First Boost) 258 is toggled on to close the first boost enable switch 256 to boost a first RST surge current through the first current source generator 231 to sink the bitline 230 with a large temporary current.

The first boost enable signal (First Boost) 258 is switched on and off after the RST gate 212 is set from high to low. This pulse of the first boost enable signal (First Boost) 258 lasts for a first RST-boost-L duration which may be the same duration of the time region 320. This pulse causes a short to the second bias transistor 252. With the on-and-off toggling of the first boost enable signal (First Boost) 258, the second bias transistor 252 is bypassed. As a result, the equivalent length $L_{boost}$ of the first current source generator 231 is reduced. Meanwhile, a simultaneous current surge is generated. It is called a first RST surge current which flows through the first current source generator 231. The first RST surge current boosts more temporary current than the normal current provided by the current source generator 231. The first RST surge current therefore pulls the unwanted bump caused by the RST voltage on the bitline 230 down much faster—evidence as shown by the solid line when compared to what the bitline 230 would have been behaved without the current boost as shown by the dashed line in FIG. 3.

The process block 420 may be followed by process block 430. Process block 430 is correlated to the time region 330 of FIG. 3. During block 430, as a result of the block 420, voltage disturbance propagated from the FD to the bitline 230 is settled much faster when the solid line is compared with the dashed line. With a much shorter wait time, after the bitline is settled, the background signal associated with the black image on the FD 208 is read to the bitline 230. The process starts with the background charges on the FD 208 being fed to the SF 216. The SF 216 converts this noise background voltage from its gate terminal 208 to its source terminal 218 as an amplified background signal. The amplified background signal on the SF source terminal 218 is finally read by the bitline 230 when enabled by the closed RS transistor 220. After the analog to digital converter (ADC) which resides in the readout circuitry 106, the digital version of the analog background signal is stored in the readout circuitry 106 for the purpose of the correlated double sampling (CDS) or other digital image processing (DIP) which takes place in the function logic 108.

The process block 430 may be followed by process block 440. Process block 440 is correlated to the time region 340 shown in FIG. 3. During block 440, photo-generated signal charges accumulated on the PD 202 are transferred to the FD 208 when the transfer transistor 204 is switched on by the TX gate voltage 206. During the same period, the RS transistor 220 remains closed by setting the RS gate voltage 222 to high. The first boost enable switch 256 maintains open by setting the first boost enable signal (First Boost) 258 to low. The second bias transistor 252 is not shorted during the process block 440.

During the block 440, voltage disturbance onto the FD 208 caused by the rising edge of the TX voltage signal is evident due to the gate-to-source tunneling effect (feedthrough) of the TX transistor 204. Such a disturbance on the FD 208 propagates to the bitline 230 through the SF transistor 216 and cause a slow rising slope on the bitline 230 as shown in the time region 340 of FIG. 3.

The process block 440 may be followed by process block 450. Process block 450 is correlated to the time region 350 shown in FIG. 3. During block 450, the FD 208 is disconnected from the PD 202 by setting the TX gate 206 to low to switch off the TX transistor 204. The first boost enable signal (First Boost) 258 is toggled on to close the first boost enable switch 256 to boost a first TX surge current through the first current source generator 231 to sink the bitline 230 with an additional large temporary current.

The first boost enable signal (First Boost) 25 is switched on and off after the TX gate 206 is set from high to low. This pulse of the first boost enable signal (First Boost) 258 lasts for a first TX-boost-L duration which may be the same duration of the time region 350. This pulse causes a short to the second bias transistor 252. With the on-and-off toggling of the first boost enable signal (First Boost) 25, the second bias transistor 252 is bypassed. As a result, the equivalent length $L_{boost}$ of the first current source generator 231 is reduced. Meanwhile, a simultaneous current surge is generated. It is called a first TX surge current which flows through the first current source generator 231. The first TX surge current boosts more temporary current than the normal current provided by the current source generator 231. The first TX surge current therefore pulls the unwanted bump caused by the TX voltage on the bitline 230 down much faster—evidence as shown by the solid line when compared to what the bitline 230 would have been behaved without the current boost as shown by the dashed line.

The values of the first RST-boost-L duration and the first TX-boost-L duration may be the same. They may also be different. The value of the first TX-boost-L duration may be longer than the value of the first RST-boost-L duration. They may also be the same or different depends on the performance. In general, these two values are independent from one another and are controlled by a control circuitry 104 through the first boost control signal (First Boost) 25.

The process block 450 may be followed by process block 460. Process block 460 is correlated to the time region 360 of FIG. 3. During block 460, as a result of the block 450, voltage disturbance propagated from the FD to the bitline 230 is settled much faster when the solid line is compared with the dashed line. With a much shorter wait time, after the bitline is settled, the image signal associated with the image charges transferred from the PD 202 to the FD 208, either with or without the optional TS transistor 207 sitting between the PD 202 to the FD 208, in block 440 is read to the bitline 230. The process starts with the image charges on the FD 208 being fed to the SF 216. The SF 216 converts this signal voltage from its gate terminal 208 to its source terminal 218 as an amplified image signal. The amplified image signal on the SF source terminal 218 is finally read by the bitline 230 when enabled by the closed RS transistor 220. After the analog to digital converter (ADC) which resides in the readout circuitry 106, the digital version of the analog image signal is stored in the readout circuitry 106 for the purpose of the correlated double sampling (CDS) or other digital image processing (DIP) which takes place in the function logic 108.

Figure 5:
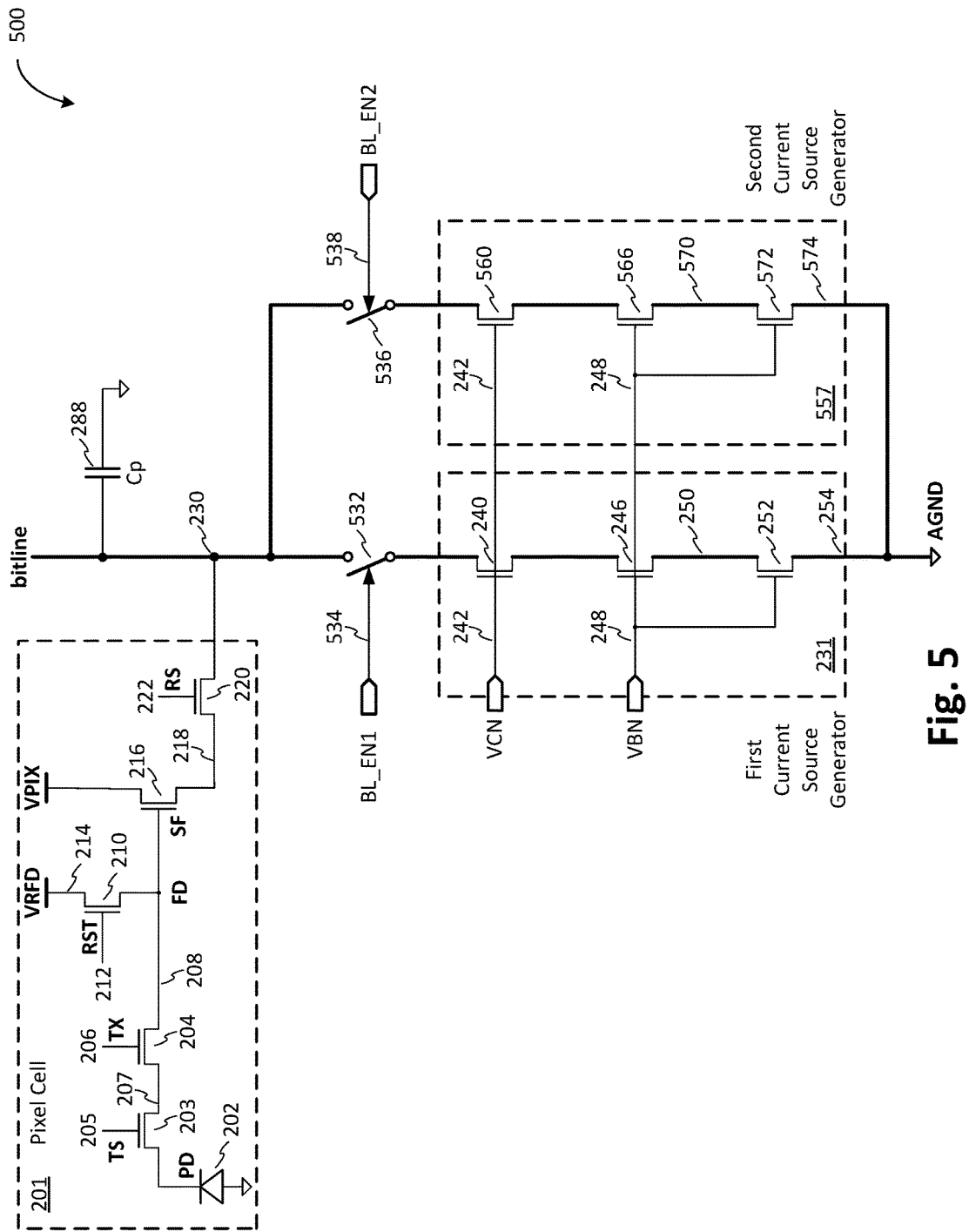
FIG. 5 is a second example schematic of a block diagram of a pixel cell and pixel output circuit in an imaging sensor that is capable of fast settling in its bitline in accordance with an embodiment of the present disclosure.

FIG. 5 is a second example of block diagram of a pixel cell and pixel output circuit in an imaging sensor that is capable of fast settling on its output line, bitline 230, in accordance with an embodiment of the present disclosure. In addition to everything disclosed in FIG. 2, three components are added new to the circuit represented by FIG. 2. These three components are: (1) a second current source (CS) generator 557 arranged in parallel to the first current source generator 231 of FIG. 2; (2) a first bitline enable switch 532 coupled between the bitline 230 and the first current source (CS) generator 231; (3) a second bitline enable switch 536 coupled between the bitline 230 and a second CS generator 557.

The first bitline enable switch 532 connects between the bitline 230 and the first CS generator 231. The first bitline enable switch 532 is controlled by a first bitline enable signal (BL_EN1) 534. The second bitline enable switch 536 connects between the bitline 230 and the second CS generator 557. The second CS generator 557 connects between the bitline 230 (through the second bitline enable switch 536) and the analog ground AGND. The second bitline enable switch 536 is controlled by a second bitline enable signal (BL_EN2) 538.

The second CS generator 557 sinks an adjustable current from the bitline 230 to the analog ground AGND through three serially connected transistors: a second cascode transistor 560, a third bias transistor 566 and a fourth bias transistor 572 when the second bitline enable switch 536 is closed. The second cascode transistor 560 is biased by the cascode control voltage (VCN) 242. Both the third bias transistor 566 and the fourth bias transistor 572 are biased by the bias control voltage (VBN) 248. An appropriate cascode control voltage VCN 242 and an appropriate bias control voltage VBN 248 are need for normal operation of the second CS generator 557.

The second CS generator 557 is also a current source like the first CS generator 231. When the second CS generator 557 is added to work side-by-side with the first CS generator 231, it also serves to boost the sinking current from the bitline 230 to the analog ground AGND.

Assume that the first CS generator 231 has an equivalent width of $W_{231}$ and the second CS generator 557 has an equivalent width of $W_{557}$. If the first bitline enable signal (BL_EN1) 534 is set to high to have the first bitline enable switch 532 closed and the second bitline enable signal (BL_EN2) 538 is set to low initially to have the first bitline enable switch 532 open, when the second CS generator 557 is added in parallel to the first CS generator 231 by setting the second bitline enable signal (BL_EN2) 538 to high, the overall equivalent width $W_{boost}$ of the two CS generators 231 and 557 increases from $W_{init}=W_{231}$ to $W_{boost}=W_{231}+W_{557}>W_{init}$. The overall current flows from the bitline 230 to the analog ground AGND is boosted when a second current source is added to contribute additional current.

In FIG. 5, either the first CS generator 231 or the second CS generator 557 may be connected initially to sink the current from the bitline 230 with the other CS generator joining in to boost the initial current under the control of the first bitline enable signal (BL_EN1) 534 and the second bitline enable signal (BL_EN2) 538, in accordance with an embodiment of the present disclosure. Both the first bitline enable signal (BL_EN1) 534 and the second bitline enable signal (BL_EN2) 538 are controlled by the control circuitry 104.

Figure 6:
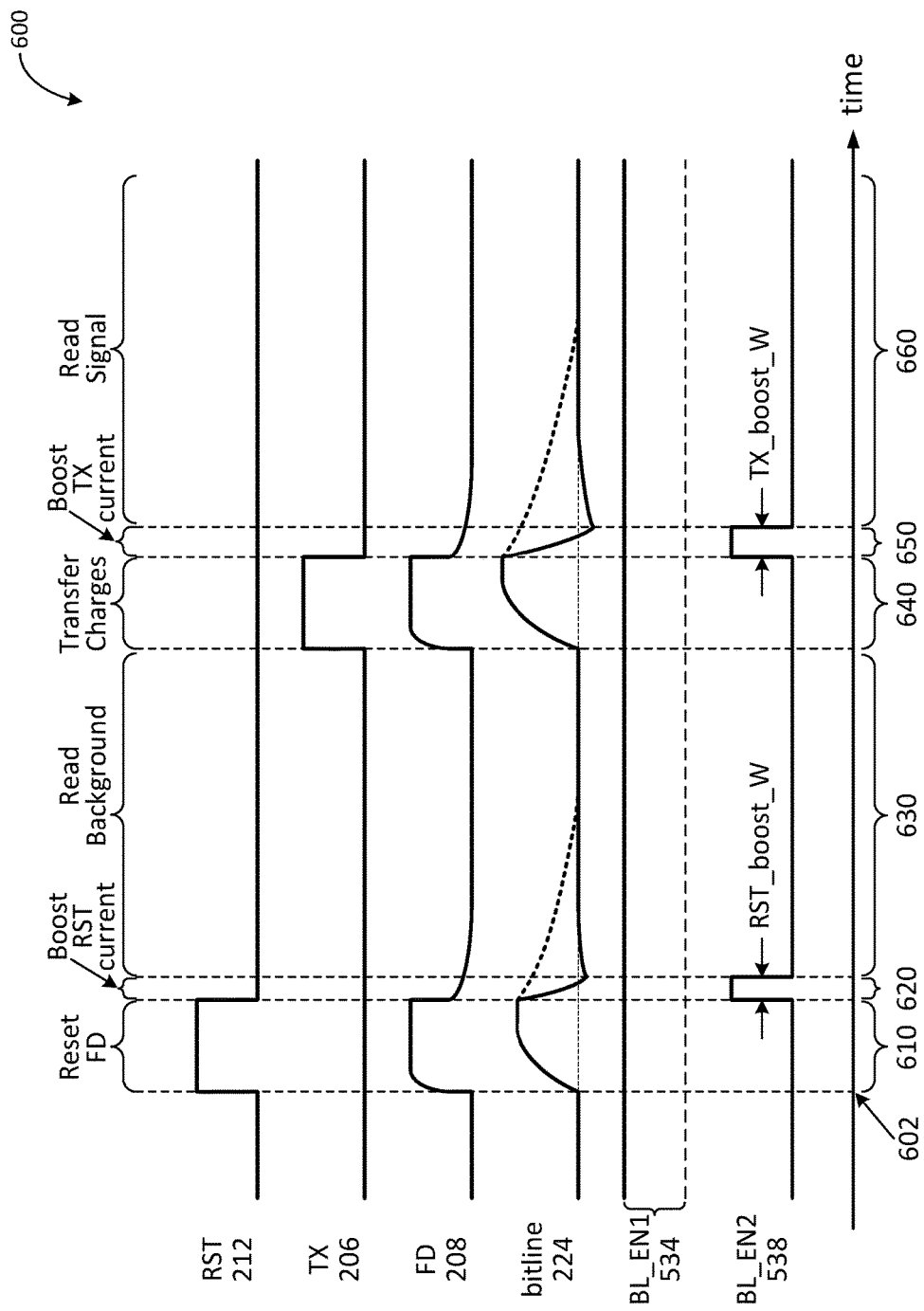
FIG. 6 is a second example waveform in association with the operation of the photodiode in an imaging sensor in dealing with bitline settling in associate with the circuit of FIG. 5 in accordance with an embodiment of the present disclosure.

FIG. 6 is an illustrative signal readout operation 600 of a pixel cell and its output circuit in an imaging sensor that is capable of fast settling of its output line, the bitline 230, in accordance with an embodiment of the present disclosure. To better understand FIG. 6 and the sequence it represents, the shared (by all embodiments disclosed) timing flowchart is provided in FIG. 4 to explain all major events that take place in FIG. 6 in conjunction with FIG. 5.

FIG. 4 is an illustrative flow chart 400 in accordance with all the embodiments of the present disclosure. The flow chart 400 may illustrate a complete cycle of row readout and demonstrates how fast settling on the bitline 230 may be achieved in a typical data readout cycle using the disclosed circuitry 500 of FIG. 5.

To reuse the shared flow chart 400 of FIG. 4, the flow chart 400 begins at process block 402. For this example here, the process block 402 is correlated to time point 602 in FIG. 6. Process block 402 marks the beginning of a readout cycle where a new row of a plurality of pixel cells is being read out by the readout circuitry 106.

To begin with, both the first cascode transistor 240 and the second cascode transistor 560 are biased by a cascode control voltage (VCN) 242. The cascode control voltage (VCN) 242 represents a positive potential to ensure normal operation of the first cascode transistor 240 and the second cascode transistor 560. The cascode control voltage (VCN) 242 needs to be high enough so that the voltage between the gate terminal and the source terminal of the first cascode transistor 240 is higher than the threshold voltage of either the first cascode transistor 240 or the second cascode transistor 560.

The first bias transistor 246, the second bias transistor 252, the third bias transistor 566, and the fourth bias transistor 572 are all biased by the same bias control voltage (VBN) 248. The bias control voltage (VBN) 248 is a positive potential to ensure normal operation of the first bias transistor 246, the second bias transistor 252, the third bias transistor 566, and the fourth bias transistor 572. The bias control voltage (VBN) 248 needs to be high enough so that either voltage between the gate terminal and the source terminal one of the first bias transistor 246, the second bias transistor 252, the third bias transistor 566, and the fourth bias transistor 572 are higher than the threshold voltage of anyone of those transistors.

In one embodiment, the first bitline enable signal (BL_EN1) 534 is initially set to high to engage the first CS generator 231 to sink normal current of the bitline 230. The first CS generator 231 and the second CS generator 557 may have the very same design and physical size to sink the same amount of current when engaged to the very same circuit. Or, the first CS generator 231 and the second CS generator 557 may also have different designs and physical sizes to sink different amount of current when engaged to the very same circuit. When the first CS generator 231 and the second CS generator 557 sink different current, they may offer a total of three different currents rather than two different currents when controlled by the three setting combinations of the first bitline enable signal (BL_EN1) 534 and the second bitline enable signal (BL_EN2) 538 to deliver non-zero current to the bitline 230.

The process block 402 may be followed by process block 410. Process block 410 is correlated to the time region 610 shown in FIG. 6. Circuit-condition-wise, during block 410, the RST transistor 210 is switched on by the RST gate voltage 212 to reset the FD 208 to the VRFD. During the same period, the RS transistor 220 remains closed by setting the RS gate voltage 222 to high. The second bitline enable switch 536 maintains open by setting the second bitline enable signal (BL_EN2) 538 to low. The second CS generator 557 is not connected to the bitline 230 yet during the process block 410.

Prior to the block 410, FD voltage is lower than the VRFD typically. During the block 410, voltage disturbance onto the FD 208 caused by the rising edge of the RST voltage signal is evident due to the reset of the FD 208 to the VRFD. Such a disturbance on the FD 208 propagates to the bitline 230 through the SF transistor 216 and cause a slow rising slope on the bitline 230 as shown in the time region 610 of FIG. 6.

The process block 410 may be followed by process block 420. Process block 420 is correlated to the time region 620 shown in FIG. 6. During block 420, the FD 208 is disconnected from the dedicated bias voltage, the VRFD for example, by setting the RST gate 212 to low to switch off the RST transistor 210. The second bitline enable signal (BL_EN2) 538 is toggled on to close the second bitline enable switch 536 to boost a second RST surge current through the second CS generator 557 in additional to the already-on first current source generator 231 to sink the bitline 230 with a large temporary current.

The second bitline enable signal (BL_EN2) 538 is switched on and off after the RST gate 212 is set from high to low. This pulse of the second bitline enable signal (BL_EN2) 538 lasts for a RST-boost-W duration which may be the same duration of the time region 620. This pulse causes the second CS generator 577 to conduct current in parallel with the already-on first CS generator 231. As a result, the equivalent width $W_{boost}$ of both current source generators 231 and 577 are increased. Meanwhile, a simultaneous current surge is generated. It is called a second RST surge current which flows through both the first CS generator 231 and the second CS generator 577. The second RST surge current boosts more temporary current than the normal current provided by the first current source generator 231. The second RST surge current therefore pulls the unwanted bump (shown in FIG. 6) caused by the RST voltage on the bitline 230 down much faster—evidence as shown by the solid line when compared to what the bitline 230 would have been behaved without the current boost as shown by the dashed line in FIG. 6.

The process block 420 may be followed by process block 430. Process block 430 is correlated to the time region 630 of FIG. 6. During block 630, as a result of the block 420, voltage disturbance propagated from the FD to the bitline 230 is settled much faster when the solid line is compared with the dashed line. With a much shorter wait time, after the bitline is settled, the background signal associated with the black image on the FD 208 is read to the bitline 230. The process starts with the background charges on the FD 208 being fed to the SF 216. The SF 216 converts this noise background voltage from its gate terminal 208 to its source terminal 218 as an amplified background signal. The amplified background signal on the SF source terminal 218 is finally read by the bitline 230 when enabled by the closed RS transistor 220. After the analog to digital converter (ADC) which resides in the readout circuitry 106, the digital version of the analog background signal is stored in the readout circuitry 106 for the purpose of the correlated double sampling (CDS) or other digital image processing (DIP) which takes place in the function logic 108.

The process block 430 may be followed by process block 440. Process block 440 is correlated to the time region 640 shown in FIG. 6. During block 640, photo-generated signal charges accumulated on the PD 202 are transferred to the FD 208 when the transfer transistor 204 is switched on by the TX gate voltage 206. During the same period, the RS transistor 220 remains closed by setting the RS gate voltage 222 to high. The second bitline enable switch 536 maintains open by setting the second bitline enable signal (BL_EN2) 538 to low. The second CS generator 557 is not connected to the bitline 230 during the process block 440.

During the block 440, voltage disturbance onto the FD 208 caused by the rising edge of the TX voltage signal is evident due to the gate-to-source tunneling effect (feedthrough) of the TX transistor 204. Such a disturbance on the FD 208 propagates to the bitline 230 through the SF transistor 216 and cause a slow rising bump on the bitline 230 as shown in the time region 640 of FIG. 6.

The process block 440 may be followed by process block 450. Process block 450 is correlated to the time region 650 shown in FIG. 6. During block 650, the FD 208 is disconnected from the PD 202 by setting the TX gate 206 to low to switch off the TX transistor 204. The second bitline enable signal (BL_EN2) 538 is toggled on to close the second bitline enable switch 536 to boost a first TX surge current through both the first CS generator 231 and the second CS generator 557 to sink the bitline 230 with a large temporary current.

The second bitline enable signal (BL_EN2) 538 is switched on and off after the TX gate 206 is set from high to low. This second bitline enable signal (BL_EN2) 538 lasts for a TX-boost-W duration which may be the same duration of the time region 650. This pulse causes a connection between the bitline 230 and the second CS generator 557. With the on-and-off toggling of the second bitline enable signal (BL_EN2) 538, the second CS generator 557 is added to boost the bitline current. As a result, the equivalent width $W_{boost}$ of the bitline current source generator the bitline 230 experiences when both bitline CS generators are involved is increased. Meanwhile, a simultaneous current surge is generated. It is called a second TX surge current which flows through both the first CS generator 231 and the second CS generator 557. The second TX surge current boosts more temporary current than the normal current provided by the first current source generator 231 alone. The second TX surge current therefore pulls the unwanted bump caused by the TX voltage on the bitline 230 down much faster— evidence as shown by the solid line when compared to what the bitline 230 would have been behaved without the current boost as shown by the dashed line.

The process block 450 may be followed by process block 460. Process block 460 is correlated to the time region 660 of FIG. 6. During block 660, as a result of the block 650, voltage disturbance propagated from the FD to the bitline 230 is settled much faster when the solid line is compared with the dashed line. With a much shorter wait time, after the bitline is settled, the image signal associated with the image charges transferred from the PD 202 to the FD 208, either with or without the optional TS transistor 207 sitting between the PD 202 to the FD 208, in block 440 is read to the bitline 230. The process starts with the image charges on the FD 208 being fed to the SF 216. The SF 216 converts this signal voltage from its gate terminal 208 to its source terminal 218 as an amplified image signal. The amplified image signal on the SF source terminal 218 is finally read by the bitline 230 when enabled by the closed RS transistor 220. After the analog to digital converter (ADC) which resides in the readout circuitry 106, the digital version of the analog image signal is stored in the readout circuitry 106 for the purpose of the correlated double sampling (CDS) or other digital image processing (DIP) which takes place in the function logic 108.

Figure 7:
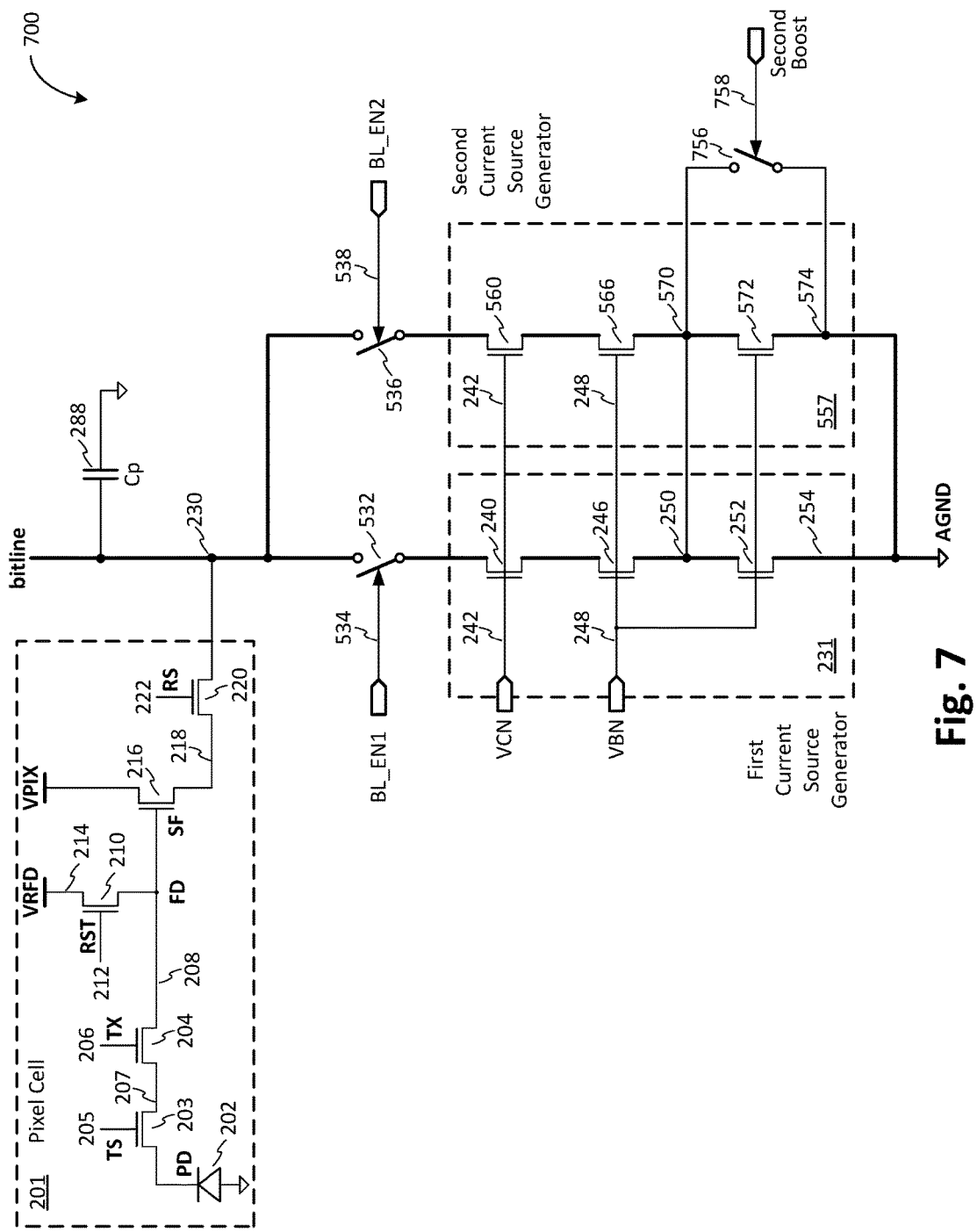
FIG. 7 is a third example schematic of a block diagram of a pixel cell and pixel output circuit in an imaging sensor that is capable of fast settling in its bitline in accordance with an embodiment of the present disclosure.

FIG. 7 is a third example of block diagram of a pixel cell and pixel output circuit in an imaging sensor that is capable of fast settling on its output line, bitline 230, in accordance with an embodiment of the present disclosure. In addition to everything disclosed in FIG. 5, two components are added new to the circuit represented by FIG. 5. These two components are: (1) a second boost enable switch 756 coupled between the drain terminal 570 and the source terminal 574 of the fourth bias transistor 572; (2) a connector coupled between the the drain terminal 570 of the fourth bias transistor 572 and the drain terminal 250 of the second bias transistor 252.

The second boost enable switch 756 connects between the drain terminal 570 and the source terminal 574 of the fourth bias transistor 572. The second boost enable switch 756 is controlled by a second boost enable signal (second Boost) 758. The second boost enable signal (second Boost) 758 is controlled by the control circuitry 104.

The connector simply links the drain terminal 570 of the fourth bias transistor 572 and the drain terminal 250 of the second bias transistor 252 together.

Assume that the first CS generator 231 has an equivalent length of $L_{231}$ and equivalent width of $W_{231}$, and the second CS generator 557 has an equivalent length of $L_{557}$ and equivalent width of $W_{557}$. If the first bitline enable signal (BL_EN1) 534 is set to high to have the first bitline enable switch 532 closed and the second bitline enable signal (BL_EN2) 538 is set to low to have the second bitline enable switch 536 open, when the second CS generator 557 is added in parallel to the first CS generator 231 by setting the second bitline enable signal (BL_EN2) 538 to high, the overall equivalent width $W_{boost}$ of the two CS generators 231 and 557 increases from $W_{init}=W_{231}$ to $W_{boost}=W_{231}+W_{557}>W_{init}$. The overall current flows from the bitline 230 to the analog ground AGND is boosted when a second current source is added. Furthermore, for $L_{231\_init}=L_{240}+L_{246}+L_{252}$ and $L_{557\_init}=L_{560}+L_{566}+L_{572}$, if both the second bias transistor 252 and the fourth bias transistor 572 are bypassed by closing the second boost enable signal (Second Boost) 758, $L_{231\_boost}=L_{240}+L_{246}<L_{231\_init}$ and $L_{557\_boost}=L_{560}+L_{566}<L_{557\_init}$. As a result, with the reduction of equivalent length of both the first CS generator 231 ($L_{231\_boost}<L_{231\_init}$) and the second CS generator 557 ($L_{557\_boost}<L_{557\_init}$), the overall current flows from the bitline 230 to the analog ground AGND is further boosted when the second boost enable switch 756 is closed by second boost enable signal (second Boost) 758.

Figure 8:
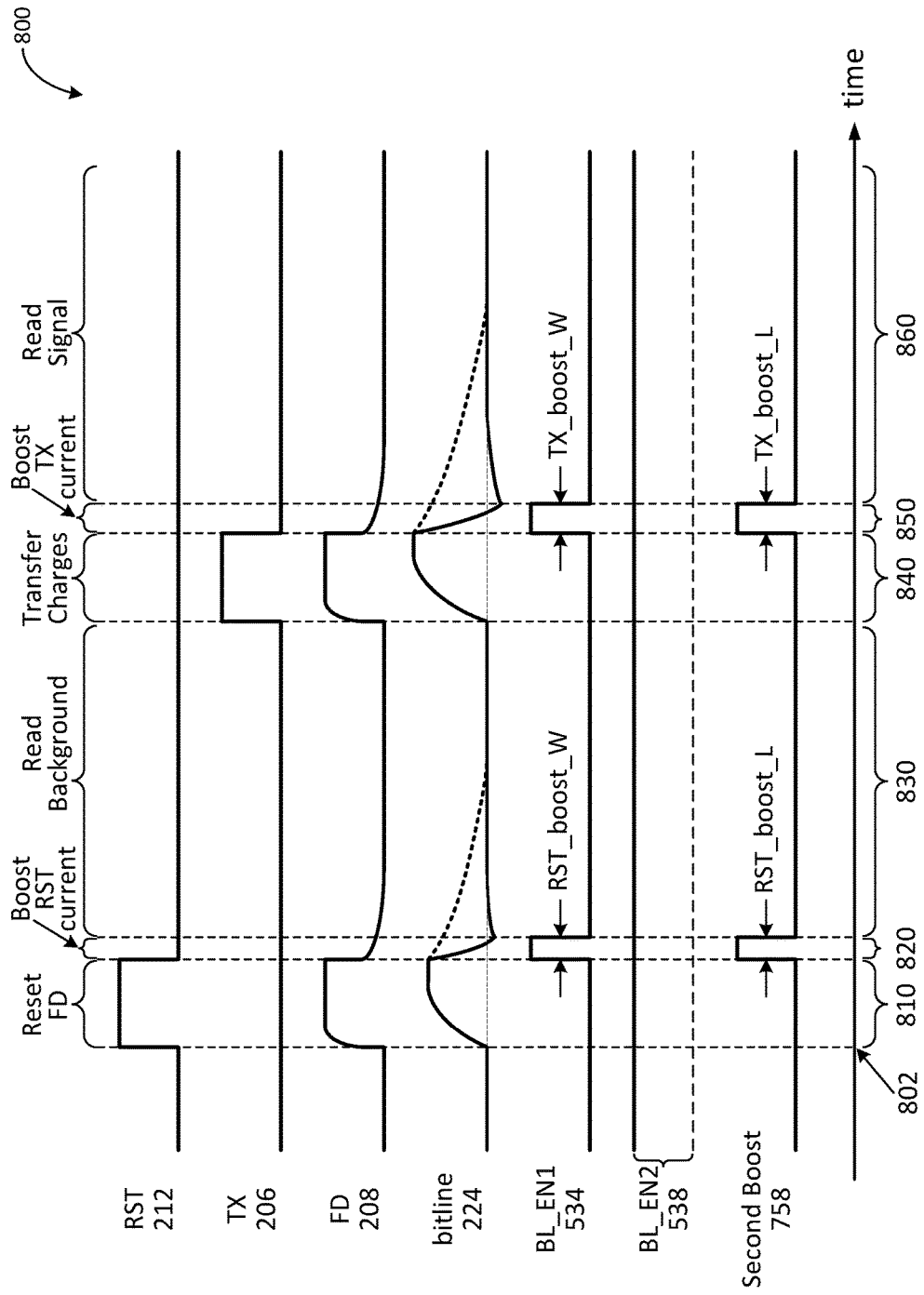
FIG. 8 is a third example waveform in association with the operation of the photodiode in an imaging sensor in dealing with bitline settling in associate with the circuit of FIG. 7 in accordance with an embodiment of the present disclosure.

FIG. 8 is an illustrative signal readout operation 800 of a pixel cell and its output circuit in an imaging sensor that is capable of fast settling of its output line, the bitline 230, in accordance with an embodiment of the present disclosure. To better understand FIG. 8 and the sequence it represents, the shared (by all embodiments disclosed) timing flowchart is provided in FIG. 4 to explain all major events that take place in FIG. 8 in conjunction with FIG. 7.

FIG. 4 is an illustrative flow chart 400 in accordance with all the embodiments of the present disclosure. The flow chart 400 may illustrate a complete cycle of row readout and demonstrates how fast settling on the bitline 230 may be achieved in a typical data readout cycle using the disclosed circuitry 700 of FIG. 7.

To reuse the shared flow chart 400 of FIG. 4, the flow chart 400 begins at process block 402. For this current example here, the process block 402 is correlated to time point 802 in FIG. 8. Process block 402 marks the beginning of a readout cycle where a new row of a plurality of pixel cells is being read out by the readout circuitry 106.

To begin, both the first cascode transistor 240 and the second cascode transistor 560 are biased by a cascode control voltage (VCN) 242. The cascode control voltage (VCN) 242 represents a positive potential to ensure normal operation of the first cascode transistor 240 and the second cascode transistor 560. The cascode control voltage (VCN) 242 needs to be high enough so that the voltage between the gate terminal and the source terminal of the first cascode transistor 240 is higher than the threshold voltage of either the first cascode transistor 240 or the second cascode transistor 560.

The first bias transistor 246, the second bias transistor 252, the third bias transistor 566, and the fourth bias transistor 572 are all biased by the same bias control voltage (VBN) 248. The bias control voltage (VBN) 248 is a positive potential to ensure normal operation of the first bias transistor 246, the second bias transistor 252, the third bias transistor 566, and the fourth bias transistor 572. The bias control voltage (VBN) 248 needs to be high enough so that either voltage between the gate terminal and the source terminal one of the first bias transistor 246, the second bias transistor 252, the third bias transistor 566, and the fourth bias transistor 572 are higher than the threshold voltage of anyone of those transistors 246, 252, 566, and 572.

In one embodiment, the second bitline enable signal (BL_EN2) 538 is initially set to high to engage the second CS generator 557 to sink normal current of the bitline 230. The first CS generator 231 and the second CS generator 557 may have the very same design and physical size to sink the same amount of current when engaged to the very same circuit. Or, the first CS generator 231 and the second CS generator 557 may also have different designs and physical sizes to sink different amount of current when engaged to the very same circuit. When the first CS generator 231 and the second CS generator 557 sink different current, they may offer a total of three different currents rather than two different currents when controlled by the three setting combinations available of the first bitline enable signal (BL_EN1) 534 and the second bitline enable signal (BL_EN2) 538 to deliver nonzero current to the bitline 230.

The process block 402 may be followed by process block 410. Process block 410 is correlated to the time region 810 shown in FIG. 8. Circuit-condition-wise, during block 410, the RST transistor 210 is switched on by the RST gate voltage 212 to reset the FD 208 to the VRFD. During the same period, the RS transistor 220 remains closed by setting the RS gate voltage 222 to high. The first bitline enable switch 532 maintains open by setting the first bitline enable signal (BL_EN1) 534 to low. The first CS generator 231 is not connected to the bitline 230 yet during the process block 410.

Prior to the block 410, FD voltage is lower than the VRFD typically During the block 410, voltage disturbance onto the FD 208 caused by the rising edge of the RST voltage signal is evident due to the reset of the FD 208 to the VRFD. Such a disturbance on the FD 208 propagates to the bitline 230 through the SF transistor 216 and cause a slow rising slope on the bitline 230 as shown in the time region 810 of FIG. 8.

The process block 410 may be followed by process block 420. Process block 420 is correlated to the time region 820 shown in FIG. 8. During block 420, the FD 208 is disconnected from the dedicated bias voltage, the VRFD for example, by setting the RST gate 212 to low to switch off the RST transistor 210. The first bitline enable signal (BL_EN1) 534 and the second bitline enable signal (second Boost) 758 are both toggled on to close both the first bitline enable switch 532 and the second boost enable switch 756. The pulse on the first bitline enable switch 532 boosts a second RST surge current through the first CS generator 231 in additional to the already-on second current source generator 557 to sink the bitline 230 with a large temporary current. During the same time of the pulse on the first bitline enable switch 532, a simultaneous pulse on the second boost enable switch 756 boosts an additional RST surge current by bypassing the second bias transistor 252 and the fourth bias transistor 572.

The first bitline enable signal (BL_EN1) 534 is switched on and off after the RST gate 212 is set from high to low. This pulse signal of the first bitline enable signal (BL_EN1) 534 lasts for a RST-boost-W duration which may be the same duration of the time region 820. This pulse causes the first CS generator 231 to conduct current in parallel with the already-on second CS generator 557. As a result, the equivalent width $W_{boost}$ of both current source generator 231 and 577 are increased. Meanwhile, a simultaneous current surge is generated. It is called a second RST surge current which flows through both the first CS generator 231 and the second CS generator 577. The second RST surge current boosts more temporary current than the normal current provided by the second current source generator 557. The second RST surge current therefore pulls the unwanted high voltage level caused by the RST voltage on the bitline 230 down much faster—evidence as shown by the solid line when compared to what the bitline 230 would have been behaved without the current boost as shown by the dashed line in FIG. 8.

In addition to the pulse signal carried by the first bitline enable signal (BL_EN1) 534, the second boost enable signal (second Boost) 758 is switched on and off simultaneously after the RST gate 212 is set from high to low. This pulse signal of the second boost enable signal (Second Boost) 758 lasts for a second RST-boost-L duration which may be the same duration of the time region 820. This pulse causes a short to the second bias transistor 252 and the fourth bias transistor 572. With the on-and-off toggling of the second boost enable signal (second Boost) 758, both the second bias transistor 252 and the fourth transistor 572 are bypassed. As a result, the equivalent length $L_{boost}$ of the first CS generator 231 and the second CS generator 557 are reduced. Meanwhile, a boost current surge is generated. It is an additional current to the second RST surge current caused by the pulse on the first bitline enable signal (BL_EN1) 534 which flows through the first current source generator 231. The total second RST surge current caused by both pulse signals from the first bitline enable signal (BL_EN1) 534 and the second boost enable signal (second Boost) 758 boosts more temporary current than the initial normal current provided by the second CS generator 557 alone. The second RST surge current therefore pulls the unwanted bump caused by the RST voltage on the bitline 230 down much faster—evidence as shown by the solid line when compared to what the bitline 230 would have been behaved without the current boost as shown by the dashed line in FIG. 8.

The process block 420 may be followed by process block 430. Process block 430 is correlated to the time region 830 of FIG. 8. During block 830, as a result of the block 420, voltage disturbance propagated from the FD to the bitline 230 is settled much faster when the solid line is compared with the dashed line. With a much shorter wait time, after the bitline is settled, the background signal associated with the black image on the FD 208 is read to the bitline 230. The process starts with the background charges on the FD 208 being fed to the SF 216. The SF 216 converts this noise background voltage from its gate terminal 208 to its source terminal 218 as an amplified background signal. The amplified background signal on the SF source terminal 218 is finally read by the bitline 230 when enabled by the closed RS transistor 220. After the analog to digital converter (ADC) which resides in the readout circuitry 106, the digital version of the analog background signal is stored in the readout circuitry 106 for the purpose of the correlated double sampling (CDS) or other digital image processing (DIP) which takes place in the function logic 108.

The process block 430 may be followed by process block 440. Process block 440 is correlated to the time region 840 shown in FIG. 8. During block 840, photo-generated signal charges accumulated on the PD 202 are transferred to the FD 208 when the transfer transistor 204 is switched on by the TX gate voltage 206. During the same period, the RS transistor 220 remains closed by setting the RS gate voltage 222 to high. The first bitline enable switch 532 maintains open by setting the first bitline enable signal (BL_EN1) 534 to low. The first CS generator 231 floating from the bitline 230 during the process block 440.

During the block 440, voltage disturbance onto the FD 208 caused by the rising edge of the TX voltage signal is evident due to the gate-to-source tunneling effect (feedthrough) of the TX transistor 204. Such a disturbance on the FD 208 propagates to the bitline 230 through the SF transistor 216 and cause a slow rising slope on the bitline 230 as shown in the time region 640 of FIG. 8.

The process block 440 may be followed by process block 450. Process block 450 is correlated to the time region 850 shown in FIG. 8. During block 850, the FD 208 is disconnected from the PD 202 by setting the TX gate 206 to low to switch off the TX transistor 204. The first bitline enable signal (BL_EN1) 534 is toggled on to close the first bitline enable switch 532 to boost a second TX surge current through both the first CS generator 231 and the second CS generator 557 to sink the bitline 230 with a large temporary current.

The first bitline enable signal (BL_EN1) 534 is switched on and off after the TX gate 206 is set from high to low. This first bitline enable signal (BL_EN1) 534 lasts for a second TX-boost-W duration which may be the same duration of the time region 850. This pulse causes a connection between the bitline 230 and the first CS generator 231. With the on-and-off toggling of the first bitline enable signal (BL_EN1) 534, the first CS generator 231 is added to boost the bitline current. As a result, the equivalent width $W_{boost}$ of the bitline current source generator the bitline 230 experiences when both bitline CS generators 231 and 557 are involved is increased. Meanwhile, a simultaneous current surge is generated. It is called a second TX surge current which flows through both the first CS generator 231 and the second CS generator 557. The second TX surge current boosts more temporary current than the normal current provided by the first current source generator 231 alone. The second TX surge current therefore pulls the unwanted bump (shown in FIG. 8) caused by the TX voltage on the bitline 230 down much faster—evidence as shown by the solid line when compared to what the bitline 230 would have been behaved without the current boost as shown by the dashed line in FIG. 8.

In addition to the pulse signal carried by the first bitline enable signal (BL_EN1) 534, the second boost enable signal (second Boost) 758 is switched on and off simultaneously after the TX gate 206 is set from high to low. This pulse signal of the second boost enable signal (Second Boost) 758 lasts for a second TX-boost-L duration which may be the same duration of the time region 850. This pulse causes a short to the second bias transistor 252 and the fourth bias transistor 572. With the on-and-off toggling of the second boost enable signal (second Boost) 758, both the second bias transistor 252 and the fourth transistor 572 are bypassed. As a result, the equivalent length $L_{boost}$ of the first CS generator 231 and the second CS generator 557 are reduced. Meanwhile, a boost current surge is generated. It is an additional current to the second RST surge current caused by the pulse on the first bitline enable signal (BL_EN1) 534 which flows through the first current source generator 231. The total second TX surge current caused by the both pulse signals from the first bitline enable signal (BL_EN1) 534 and the second boost enable signal (second Boost) 758 boosts more temporary current than the initial normal current provided by the second CS generator 557 alone. The second TX surge current therefore pulls the unwanted bump caused by the TX voltage on the bitline 230 down much faster—evidence as shown by the solid line when compared to what the bitline 230 would have been behaved without the current boost as shown by the dashed line in FIG. 8.

The values of the second RST-boost-L duration and the second RST-boost-W duration may be the same or may be different. The values of the second TX-boost-L duration and the second TX-boost-W duration may be the same or may be different. The values of the second RST-boost-L duration, the second RST-boost-W duration, the second TX-boost-L duration, and the second TX-boost-W duration are all independent from each other and are controlled by the control circuitry 104 through the first bitline enable signal (BL_EN1) 534, the second bitline enable signal (BL_EN2) 538, and the second boost control signal (second Boost) 758.

The pulse of the first bitline enable signal (BL_EN1) 534 or the pulse of the second bitline enable signal (BL_EN2) 538 may fully overlap with the pulse of the second boost control signal (Second Boost) 758. They may also partially overlap with the pulse of the second boost control signal (Second Boost) 758.

The process block 450 may be followed by process block 460. Process block 460 is correlated to the time region 860 of FIG. 8. During block 860, as a result of the block 850, voltage disturbance propagated from the FD to the bitline 230 is settled much faster when the solid line is compared with the dashed line. With a much shorter wait time, after the bitline is settled, the image signal associated with the image charges transferred from the PD 202 to the FD 208, either with or without the optional TS transistor 207 sitting between the PD 202 to the FD 208, in block 440 is read to the bitline 230. The process starts with the image charges on the FD 208 being fed to the SF 216. The SF 216 converts this signal voltage from its gate terminal 208 to its source terminal 218 as an amplified image signal. The amplified image signal on the SF source terminal 218 is finally read by the bitline 230 when enabled by the closed RS transistor 220. After the analog to digital converter (ADC) which resides in the readout circuitry 106, the digital version of the analog image signal is stored in the readout circuitry 106 for the purpose of the correlated double sampling (CDS) or other digital image processing (DIP) which takes place in the function logic 108.

The above description of illustrated examples of the invention, including what is described in the Abstract, is not intended to be exhaustive or to limit the invention to the precise forms disclosed. While specific examples of the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific examples disclosed in the specification. Rather, the scope of the invention is to be determined entirely by the following claims, which are to be construed in accordance with established doctrines of claim interpretation.

What is claimed is:

1. A fast settling output line circuit, comprising: a photodiode (PD) adapted to accumulate image charges in response to incident light; at least one transfer (TX) transistor coupled between the PD and a floating diffusion (FD) to transfer the image charges from the PD to the floating diffusion (FD), wherein a transfer (TX) gate signal controls transmission of the image charges from a TX receiving terminal of the TX transistor to the FD; a reset (RST) transistor coupled to supply a reset FD voltage (VRFD) to the FD, wherein a reset (RST) gate voltage controls the RST transistor; a source follower (SF) transistor coupled to receive a voltage of the FD from a SF gate terminal and provide an amplified signal to a SF source terminal; and a first current source generator coupled between a bitline and a ground (AGND), wherein the first current source generator sinks current through a first cascode transistor, a first bias transistor and a second bias transistor, wherein the first cascode transistor is biased by a cascode control voltage (VCN), and wherein the first bias transistor and the second bias transistor are biased by a bias control voltage (VBN).

2. The fast settling output line circuit of claim 1, further comprising a transfer storage (TS) transistor coupled between the PD and the TX transistor to transfer the image charges accumulated in the PD to the TX receiving terminal of the TX transistor, wherein a transfer storage gate (TSG) voltage controls the transfer storage (TS) transistor.

3. The fast settling output line circuit of claim 1, further comprising a row select (RS) transistor coupled between the SF source terminal and the bitline, wherein a row select (RS) gate voltage controls the RS transistor, and wherein the RS transistor passes the amplified signal from the SF source terminal to the bitline.

4. The fast settling output line circuit of claim 1, further comprising a row select (RS) transistor coupled between the SF drain terminal and a pixel voltage (VPIX), wherein a row select (RS) gate voltage controls the RS transistor, wherein the RS transistor passes the VPIX to the SF drain terminal, and wherein the SF source terminal connects to the bitline.

5. The fast settling output line circuit of claim 4, wherein the VPIX connects to a supply voltage AVDD.

6. The fast settling output line circuit of claim 4, wherein the VPIX connects to a regulated voltage supply, wherein the regulated voltage supply is regulated based on the AVDD.

7. The fast settling output line circuit of claim 4, wherein the VPIX and the VRFD have the same value.

8. The fast settling output line circuit of claim 4, wherein the VPIX and the VRFD have different values.

9. The fast settling output line circuit of claim 1, further comprising a first boost enable switch coupled between a drain terminal and a source terminal of the second bias transistor, wherein the first boost enable switch is controlled by a first boost enable signal.

10. The fast settling output line circuit of claim 1, further comprising:
a first bitline enable switch coupled between the bitline and the first current source generator, wherein the first bitline enable switch is controlled by a first bitline enable signal (BL_EN1); and
a second bitline enable switch coupled between the bitline and a second current source generator, wherein the second current source generator is coupled between the bitline and the AGND through the second bitline enable switch, and wherein the second bitline enable switch is controlled by a second bitline enable signal (BL_EN2).

11. The fast settling output line circuit of claim 10, wherein the second current source generator sinks current from the bitline to the AGND through a second cascode transistor, a third bias transistor and a fourth bias transistor when the second bitline enable switch is closed, wherein the second cascode transistor is biased by the cascode control voltage (VCN), and wherein the third bias transistor and the fourth bias transistor are biased by the bias control voltage (VBN).

12. The fast settling output line circuit of claim 11, wherein a second boost enable switch is coupled between a drain terminal and a source terminal of the fourth bias transistor, and wherein the second boost enable switch is controlled by a second boost enable signal.

13. The fast settling output line circuit of claim 11, wherein the drain terminal of the second bias transistor and the drain terminal of the fourth bias transistor are connected.

14. The fast settling output line circuit of claim 10, wherein each of the first current source generator and the second current source generator sinks a different amount of current between the bitline and the AGND.

15. The fast settling output line circuit of claim 10, wherein each of the first current source generator and the second current source generator sinks a same amount of current between the bitline and the AGND.

16. A method of fast settling an output line circuit, comprising: maintaining a high potential to a row select (RS) enable to switch on a row select (RS) transistor; maintaining a cascode control voltage (VCN) to bias a first cascode transistor, wherein the cascode control voltage (VCN) is a positive potential to ensure normal operation of the first cascode transistor; maintaining a bias control voltage (VBN) to bias a first bias transistor and a second bias transistor, wherein the bias control voltage (VBN) is a positive potential to ensure normal operation of the first bias transistor and the second bias transistor; maintaining a low potential to a first boost enable signal to open a first boost enable switch; resetting a floating diffusion (FD) to a reset FD voltage (VRFD) by setting a reset (RST) gate to high to switch on a reset (RST) transistor; disconnecting the FD from the reset FD voltage (VRFD) by setting the RST gate to low to switch off the RST transistor; boosting one of a first RST surge current and a second RST surge current to sink a bitline; reading background charges on the FD, wherein the SF converts a background voltage from its gate terminal and provides an amplified background signal to the bitline on the SF source terminal when enabled by the closed RS transistor; transferring charges from a TX receiving terminal to a floating diffusion (FD) by setting a transfer (TX) gate to high to switch on a transfer (TX) transistor; discontinuing the charge transferring to the FD by setting the TX gate to low to switch off the TX transistor; boosting one of a first TX surge current and a second TX surge current to sink a bitline; and reading the image charges on the FD, wherein the SF converts an image signal from its gate terminal and provides an amplified image signal to the bitline on the SF source terminal when enabled by the closed RS transistor.

17. The method of claim 16, further comprising:
toggling on and off the first boost enable signal to close the first boost enable switch to boost a first RST surge current through a first current source generator to sink the bitline with a large temporary current, wherein the first boost enable signal is switched on after the RST gate is set from high to low for a first RST-boost-L duration and then switched off to generate an on-and-off first RST settling pulse to control the second bias transistor, wherein a simultaneous on-and-off first RST surge current surges under the control of the on-and-off toggling of the first boost enable signal and provides the first RST surge current through the first current source generator, and wherein the first RST surge current on the current source generator enables more current on the bitline to flow through the first current source generator.

18. The method of claim 17, further comprising:
toggling on and off the first boost enable signal to close the first boost enable switch to boost a first TX surge current through a first current source generator to sink the bitline with a large temporary current, wherein the first boost enable signal is switched on after the TX gate is set from high to low for a first TX-boost-L duration and then switched off to generate an on-and-off first TX settling pulse to control the second bias transistor, wherein a simultaneous on-and-off first TX surge current surges under the control of the on-and-off toggling of the first boost enable signal and provides the first TX surge current through the first current source generator, and wherein the first TX surge current on the current source generator enables more current on the bitline to flow through the first current source generator.

19. The method of claim 18, wherein the values of the first RST-boost-L duration and the first TX-boost-L duration are independent from one another and are controlled by a control circuitry through the first boost control signal.

20. The method of claim 16, further comprising:
switching on one of a first bitline enable switch and a second bitline enable switch; and
toggling on and off one of the first bitline enable signal (BL_EN1) and the second bitline enable signal (BL_EN2) after the RST gate is set from high to low, wherein one of the first bitline enable switch and the second bitline enable switch is switched on for a second RST-boost-W duration and then switched off to generate an on and off second RST settling pulse to one of a first current source generator and a second current source generator.

21. The method of claim 20, further comprising:
toggling on and off a second boost enable signal to close a second boost enable switch to boost a second RST surge current through a first current source generator and a second current source generator to sink a large temporary current from the bitline, wherein the second boost enable signal is switched on after the RST gate is set from high to low for a second RST-boost-L duration and then switched off to generate an on-and-off second RST pulse to the fourth bias transistor, wherein a simultaneous on-and-off second RST surge current surges under the control of the on-and-off toggling of the second boost enable signal and the second RST surge current flows through the first current source generator and the second current source generator, and wherein the second RST surge current on the first current source generator and the second current source generator enable more current to flow from the bitline to AGND through the first current source generator and the second current source generator.

22. The method of claim 21, further comprising:
switching on one of a first bitline enable switch and a second bitline enable switch; and
toggling on and off one of the first bitline enable switch and the second bitline enable switch after the TX gate is set from high to low, wherein one of the first bitline enable switch and the second bitline enable switch is switched on for a second TX-boost-W duration and then switched off to generate an on and off pulse to control one of a first current source generator and a second current source generator.

23. The method of claim 22, further comprising:
toggling on and off the second boost enable signal to close the second boost enable switch to boost a second TX surge current through the first current source generator and the second current source generator to sink a large temporary current from the bitline, wherein the second boost enable signal is switched on after the TX gate is set from high to low for a second TX-boost-L duration and then switched off to generate an on-and-off pulse to control the fourth bias transistor, wherein a simultaneous on-and-off second TX surge current surges under the control of the on-and-off toggling of the second boost enable signal and provides the second TX surge current through the first current source generator and the second current source generator, and wherein the second TX surge current on the first current source generator and the second current source generator enable more current to flow from the bitline to the AGND through the first current source generator and the second current source generator.

24. The method of claim 23, wherein the values of the second RST-boost-L duration, the second RST-boost-W duration, the second TX-boost-L duration, and the second TX-boost-W duration are all independent from each other and are controlled by the control circuitry through the first bitline enable signal (BL_EN1), the second bitline enable signal (BL_EN2), and the second boost control signal.

25. The method of claim 21, wherein one of the pulses of the first bitline enable signal (BL_EN1) and the second bitline enable signal (BL_EN2) is partially overlapped with the pulse of the second boost control signal.

26. The method of claim 21, wherein one of the pulses of the first bitline enable signal (BL_EN1) and the second bitline enable signal (BL_EN2) is completely overlapped with the pulse of the second boost control signal.

27. An imaging system with a fast settling output line circuit, comprising:
a pixel array of pixel cells, wherein each one of the pixel cell includes:
  a photodiode (PD) adapted to accumulate image charges in response to incident light;
  at least one transfer (TX) transistor coupled between the PD and a floating diffusion (FD) to transfer the image charges from the PD to the floating diffusion (FD), wherein a transfer (TX) gate voltage controls the transmission of the image charges from a TX receiving terminal of the TX transistor to the FD;
  a reset (RST) transistor coupled to supply a reset FD voltage (VRFD) to the FD, wherein a reset (RST) gate voltage controls the RST transistor; and
  a source follower (SF) transistor coupled to receive voltage of the FD from a SF gate terminal and provide an amplified signal to a SF source terminal;
a first current source generator coupled between a bitline and a ground (AGND), wherein the first current source generator sinks current through a first cascode transistor, a first bias transistor and a second bias transistor, wherein the first cascode transistor is biased by a cascode control voltage (VCN), and wherein the first bias transistor and the second bias transistor are biased by a bias control voltage (VBN);
a control circuitry coupled to the pixel array to control operation of the pixel array, wherein the control circuitry provides the TX gate voltage, the RST gate voltage, the RS gate voltage, the cascode control voltage (VCN), the bias control voltage (VBN), the first boost enable signal, the first bitline enable signal, the second bitline enable signal, and the second boost enable signal;
a readout circuitry coupled to the pixel array through a plurality of readout columns to readout image data from the plurality of pixels; and
a function logic coupled to receive image data from the readout circuitry to store the image data from each one of the plurality of pixel cells, wherein the function logic provides instructions to the control circuitry.

28. The fast settling imaging system of claim 27, further comprising a transfer storage (TS) transistor coupled between the PD and the TX transistor to transfer the image charges accumulated in the PD to the TX receiving terminal of the TX transistor, wherein a transfer storage gate (TSG) voltage controls the TS transistor.

29. The fast settling imaging system of claim 27, further comprising a row select (RS) transistor coupled between the SF source terminal and the bitline, wherein a row select (RS) gate voltage controls the RS transistor, and wherein the RS transistor passes the amplified signal from the SF source terminal to the bitline.

30. The fast settling imaging system of claim 27, further comprising a row select (RS) transistor coupled between the SF drain terminal and a pixel voltage (VPIX), wherein a row select (RS) gate voltage controls the RS transistor, wherein the RS transistor passes the VPIX to the SF drain terminal, and wherein the SF source terminal connects to the bitline.

31. The fast settling imaging system of claim 30, wherein the VPIX connects to a supply voltage AVDD.

32. The fast settling imaging system of claim 30, wherein the VPIX connects to a regulated voltage supply, wherein the regulated voltage supply is regulated based on the AVDD.

33. The fast settling imaging system of claim 30, wherein the VPIX and the VRFD have the same value.

34. The fast settling imaging system of claim 30, wherein the VPIX and the VRFD have different values.

35. The fast settling imaging system of claim 27, further comprising a first boost enable switch coupled between a drain terminal and a source terminal of the second bias transistor, wherein the first boost enable switch is controlled by a first boost enable signal.

36. The fast settling imaging system of claim 27, further comprising:
a first bitline enable switch coupled between the bitline and the first current source generator, wherein the first bitline enable switch is controlled by a first bitline enable signal (BL_EN1); and
a second bitline enable switch coupled between the bitline and a second current source generator, wherein the second current source generator is coupled between the bitline and the AGND through the second bitline enable switch, and wherein the second bitline enable switch is controlled by a second bitline enable signal (BL_EN2).

37. The fast settling imaging system of claim 36, wherein the second current source generator sinks current from the bitline to the analog ground AGND through a second cascode transistor, a third bias transistor and a fourth bias transistor when the second bitline enable switch is closed, wherein the second cascode transistor is biased by the cascode control voltage (VCN), and wherein the third bias transistor and the fourth bias transistor are biased by the bias control voltage (VBN).

38. The fast settling imaging system of claim 37, wherein a second boost enable switch is coupled between a drain terminal and a source terminal of the fourth bias transistor, and wherein the second boost enable switch is controlled by a second boost enable signal.

39. The fast settling imaging system of claim 37, wherein the drain terminal of the second bias transistor and the drain terminal of the fourth bias transistor are connected.

40. The fast settling imaging system of claim 36, wherein each of the first current source generator and the second current source generator sinks a different amount of current between the bitline and the AGND.

41. The fast settling imaging system of claim 36, wherein each of the first current source generator and the second current source generator sinks a same amount of current between the bitline and the AGND.

\* \* \* \* \*